US005402447A

United States Patent [19]

Roney, IV

[11] Patent Number: 5,402,447

[45] Date of Patent: Mar. 28, 1995

[54] SPEECH DECODING IN A ZERO BER ENVIRONMENT

[75] Inventor: Edward M. Roney, IV, Grayslake, Ill.

[73] Assignee: Motorola, Inc., Schaumburg, Ill.

[21] Appl. No.: 26,664

[22] Filed: Mar. 5, 1993

[51] Int. Cl.$^{6}$ .......................... H03D 1/00; H04L 27/06

[52] U.S. Cl. .................................... 375/340; 375/261; 371/43

[58] Field of Search ............... 375/39, 94, 80; 371/43, 371/44, 46; 341/94

[56] References Cited

U.S. PATENT DOCUMENTS 4,939,734 7/1990 Heichler .............................. 371/43

5,168,509 12/1992 Nakamura et al. .................. 375/39

5,233,630 8/1993 Wolf ...................................... 371/43

*Primary Examiner*—Stephen Chin

*Assistant Examiner*—Don Vo

*Attorney, Agent, or Firm*—Kevin D. Kaschke

[57] ABSTRACT

The decoding process of the present invention receives encoded data over a channel, decodes the data, and estimates the number of errors induced by the channel. The decoded date is stored in memory. If no errors were detected, the data stored in memory is used as the decoded signal. The process of the present invention requires reduced processing time by the processor thereby reducing the power requirements of the processor.

5 Claims, 3 Drawing Sheets

SPEECH DECODING IN A ZERO BER ENVIRONMENT

FIELD OF THE INVENTION

The present invention relates generally to the field of communications and particularly to decoding a convolutionally encoded signal.

BACKGROUND OF THE INVENTION

As communication devices become more complex, they typically have larger power requirements. This, in part, is due to complex software requiring the processor to operate for long periods of time and/or at a higher clock rate. Both conditions causing the processor to draw more current. In a portable, battery powered device, this depletes the battery's power quicker.

The processor in a communication device, such as a radiotelephone, performs processes to generate the bit error rate (BER) of user information and decode convolutionally encoded user information and control signals transmitted from a cellular base station. The EIA/TIA specification uses user information to denote the speech parameters generated by the vocoder. The BER can be used by the processor to mute audio, as a display indication, FACCH or user information determination, and channel quality estimation.

The control signals are transmitted over a control channel that is referred to in the art as a Fast Associated Control Channel (FACCH). This channel is a blank-and-burst channel for signalling message exchange between the base station and the mobile station.

FACCH decoding is performed before user information decoding. This is due to the lack of robustness in the cyclic redundancy check (CRC) performed after user information decoding to determine the validity of the user information; FACCH data will be mistaken for user information, thus losing the FACCH message.

FACCH and user information convolutionally encoded data share the same location during transmission, therefore only one message type can be present at any one time. Because user information convolutionally encoded data is transmitted more frequently than FACCH convolutionally encoded data, the execution of the FACCH decoding algorithms before the user information decoding algorithms becomes wasteful of instruction cycles and thus current drain. It is unknown whether a FACCH message or user information is going to be received. Therefore, both must be checked using million instructions per second (MIPS) exhaustive algorithms. Reducing this requirement would reduce the current drain of the processor in addition to freeing the processor to do other tasks. There is a resulting need for a process to decode a convolutionally encoded signal using a minimum amount of processor time.

SUMMARY OF THE INVENTION

The present invention encompasses a process for decoding a convolutionally encoded signal that has been encoded by a first transfer function. The method processes the convolutionally encoded signal with a second transfer function to generate a first output signal. The first output signal is saved. The encoded signal is also processed by a third transfer function to generate a second output signal. The first and the second output signals are combined to generate an error signal. If the error signal indicates zero errors, the first saved output signal is the decoded signal.

DETAILED DESCRIPTION OF THE PREFERRED EMBODIMENT

Figure 1:
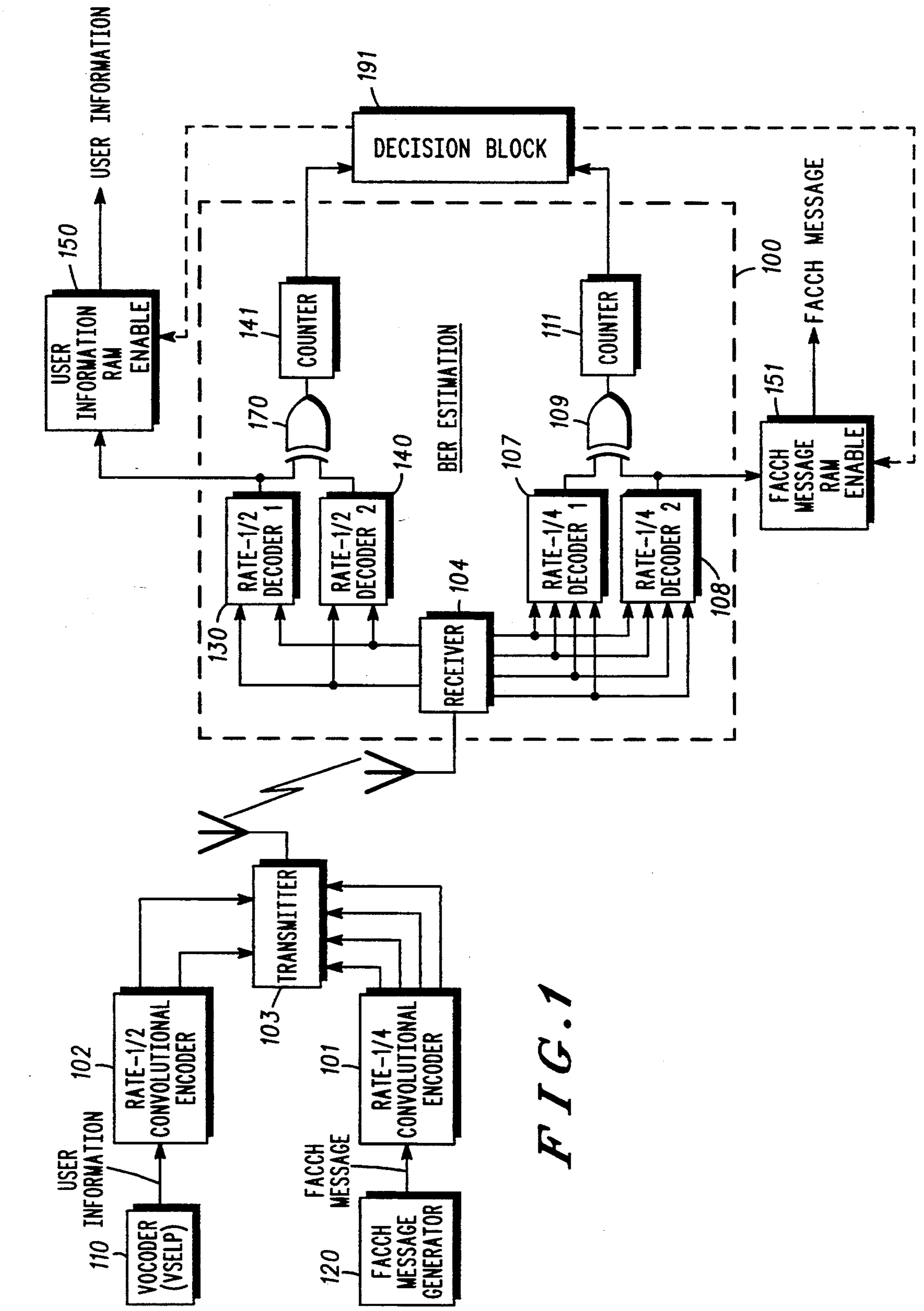
FIG. 1 shows a block diagram of the process of the present invention.

A block diagram of the decoding process of the present invention (100) is illustrated in FIG. 1. FIG. 1 additionally illustrates the system of which the BER estimation process (100) is a part.

Referring to FIG. 1, the system is comprised of two paths: a user information path and a FACCH message path. The user information that, in the preferred embodiment, are speech parameters determined and encoded by the speech coder (110) using a code excited linear predictive coding technique. In the preferred embodiment, this technique is referred to as vector-sum excited linear predictive (VSELP) coding. A technique description of this technique, *Vector Sum Excited Linear Production* 13000 *Bit Per Second Voice Coding Algorithm Including Error Control for Digital Cellular,* is published by and available from Motorola Inc.

The baseband user information is then processed by a rate-½ convolutional encoder (102). This encoder is comprised of generator polynomials that add redundancy to the speech data for error correction purposes. The generator polynomials are as follows:

$$g_0(D)=1+D+D^3+D^5$$

$$g_1(D)=1+D^2+D^3+D^4+D^5$$

These equations are referenced in Interim Standard-54 (Rev. A) from the Electronic Industries Association.

'D' represents the delay operator, the power of 'D' denoting the number of time units a bit is delayed with respect to the initial bit in the sequence. This notation is defined by Shu Lin and Daniel Costello in *Error Control Coding: Fundamentals and Applications,* (1983), p. 330.

The outputs from the rate-½ convolutional encoder (102) are input to a transmitter (103) for transmission over the channel. Convolutionally encoded FACCH and user information cannot be sent simultaneously. The convolutionally encoded FACCH message replaces the convolutionally encoded user information whenever system considerations deem it appropriate. The signal is received by a receiver (104) and input to a BER estimation process (100).

The received convolutionally encoded user information is input to two separate and distinct rate-½ decoders (130 and 140) containing polynomials that are the inverses of the generator polynomials used in rate-½ convolutional encoding transfer function. The outputs of these decoders (130 and 140) will be an estimate of the original data before rate-½ convolutional encoding. By using two separate and distinct decoders representing the inverse of the original encoder, the decoder outputs, when errors are induced, will also be distinct. The polynomials used in the first rate-½ decoder (130) are:

$$h_0(D)=1+D^1+D^4$$

$$h_1(D)=D^2+D^3+D^4$$

Figure 2:
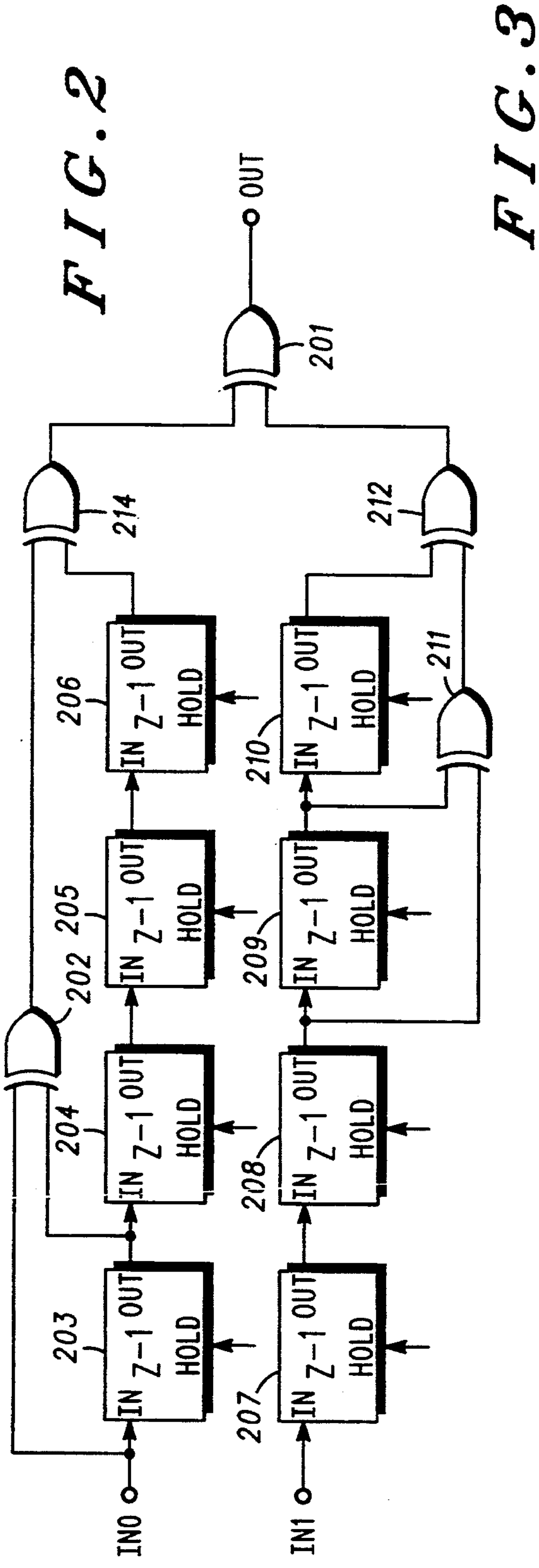
FIG. 2 shows a block diagram of a first rate-½ decoder.

The first decoder (130) is illustrated in FIG. 2. This decoder (130) is comprised of two input paths that are XORed (201) to generate the output data. The first input path XORs (202) one of the input signals with the same input signal delayed by one unit of delay (203). The output of this XOR operation (202) is itself XORed (214) with this first input delayed by four units of delay (203–206). The second input path first XORs (211) the second input signal delay with two units of delay (207 and 208) with the same input signal delayed by three units of delay (207–209). The output of this XOR operation (211) is then XORed (212) with the second input signal delayed by four units of delay (207–210).

Figure 3:
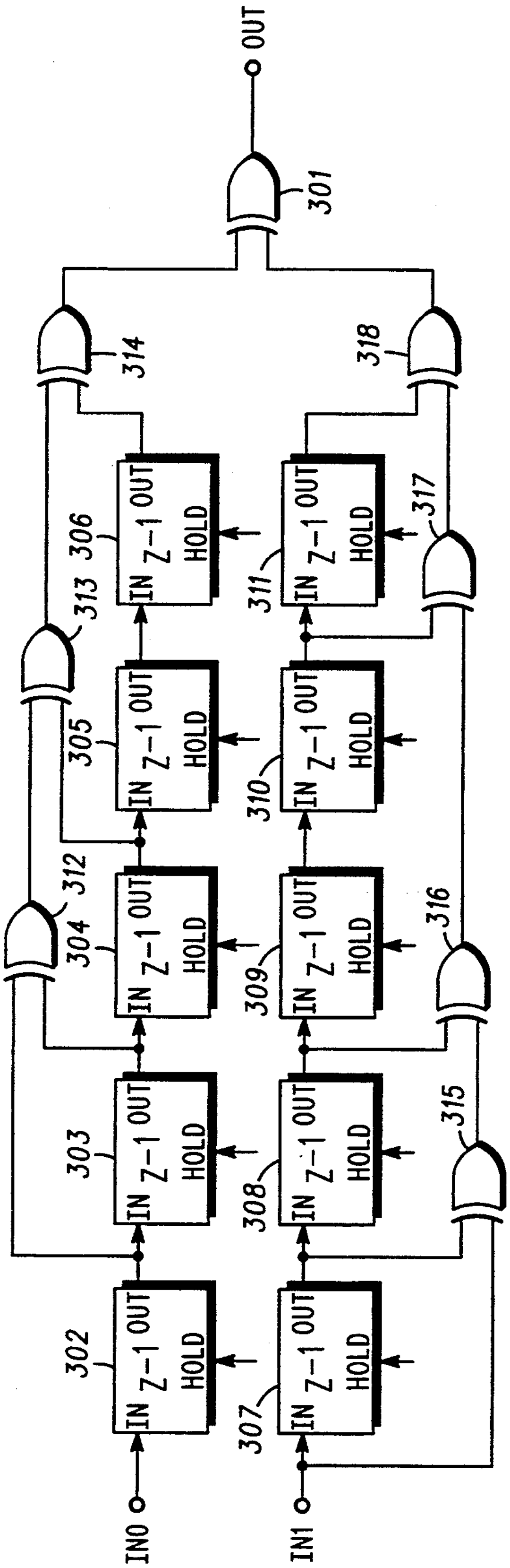
FIG. 3 shows a block diagram of a second rate-½ decoder.

The second rate-½ decoder (140) uses the following polynomials and is illustrated in FIG. 3:

$$h_0(D)=D^1+D^2+D^3+D^5$$

$$h_1(D)=1+D^1+D^2+D^4+D^5$$

Referring to FIG. 3, the decoder (140) is comprised of two input paths that are XORed (301) to generate the output data. The first input path XORs (312) the first input delayed by one delay unit (302) with the same input delayed by two delay units (302 and 303). The result of this XOR operation (312) is XORed (313) with the first input delayed by three delay units (302–304). The result of this XOR operation (313) is then XORed (314) with the first input signal delayed by five delay units (302–306). The second input path XORs (315) the second input signal with the second input signal delayed by one delay unit (307). The result of this XOR operation (315) is XORed (316) with the second input signal delayed by two delay units (307 and 308). The result of this operation (316) is then XORed (317) with the second input signal delayed by four delay units (307–310). This result is then XORed (318) with the second input signal delayed by five delay units (307–311).

An output of one of the rate-½ decoders (130 or 140) is input to a storage device (150) for later use. In the preferred embodiment, this storage device is random access memory (RAM) (150). It not important which output signal to store since, unless the signals contain errors, both output signals are the same.

The outputs of the rate-½ decoders (130 and 140) are XORed (170). This function can be accomplished by a hardware XOR gate or by a software process. This output of the XOR operation (170) produces a number of bits in error proportional to the BER of the channel.

A counter (141) keeps track of the number of errors found. The counter (141) is coupled to the output of the XOR operation. This count function can also be a hardware counter or a software process. The output of the count operation is an estimate of the number of bits in error for the user information.

The process followed over the FACCH data path is similar to the above described process for the user information path; the main difference being the use of a rate-¼ convolutional encoder to generate the baseband FACCH data signal for transmission. FIG. 1 illustrates the FACCH portion of the BER estimation process of the present invention in conjunction with the surrounding system.

The generator polynomials for the rate-¼ convolutional encoder (101) are:

$$g_0(D)=1+D+D^3+D^4+D^5$$

$$g_1(D)=1+D+D^2+D^4+D^5$$

$$g_2(D)=1+D+D^2+D^3+D^5$$

$$g_3(D)=1+D^2+D^5$$

These equations are referenced in Interim Standard-54 (Rev. A) from the Electronic Industries Association.

Referring to FIG. 1, the FACCH data, from the FACCH message generator (120), are input to the rate-¼ convolutional encoder (101). Redundancy is added in this step to aid in error correction. The convolutionally encoded data stream is transmitted (103) over the channel to be received by a receiver (104). The received convolutionally encoded FACCH data are then input to the BER estimation process (100) of the present invention.

The convolutionally encoded FACCH data are input to two separate and distinct rate-¼ decoders (107 and 108), each using an inverse of the original rate-¼ convolutional encoding transfer function. The first rate-¼ decoder (107), illustrated in greater detail in FIG. 4, uses the following polynomials:

$$h_0(D)=1$$

$$h_1(D)=D^2$$

$$h_2(D)=1+D^2$$

$$h_3(D)=1$$

Figure 4:
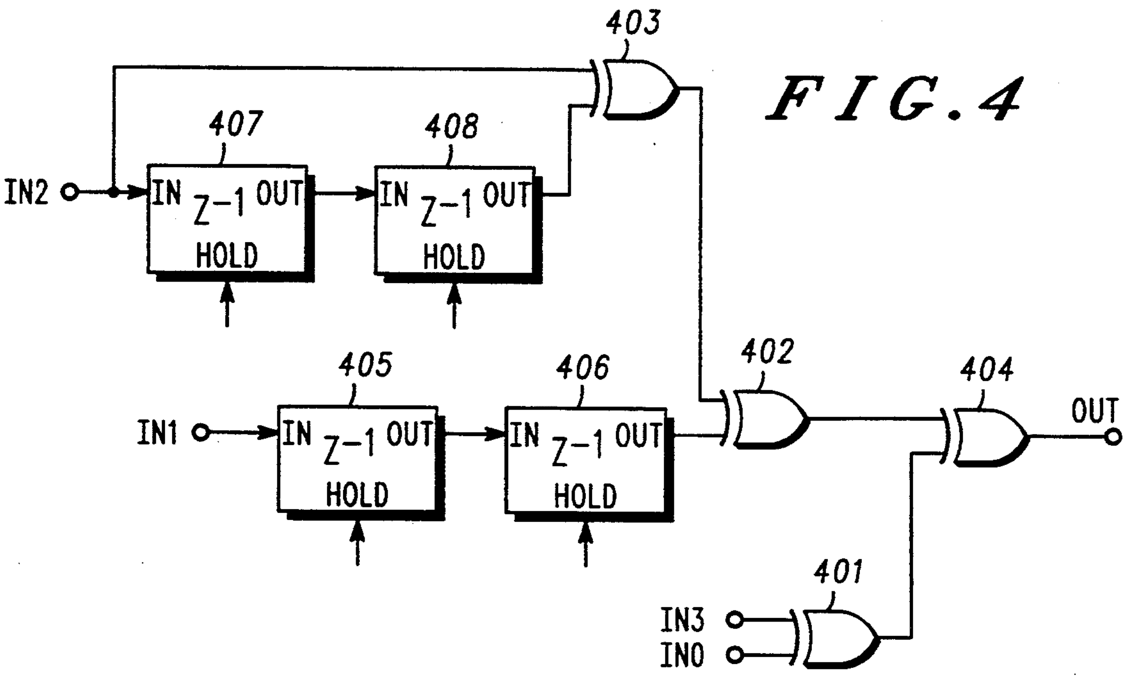
FIG. 4 shows a block diagram of a first rate-¼ decoder.

Referring to FIG. 4, this decoder (107) XORs (403) one of the inputs with the same input delayed by two delay units (407 and 408). The result of this operation (403) is XORed (402) with a second input delayed by two delay units (405 and 406). The result of this XOR operation (402) is XORed (404) with the XOR (401) of the remaining two inputs to generate the output of the decoder (107).

Figure 5:
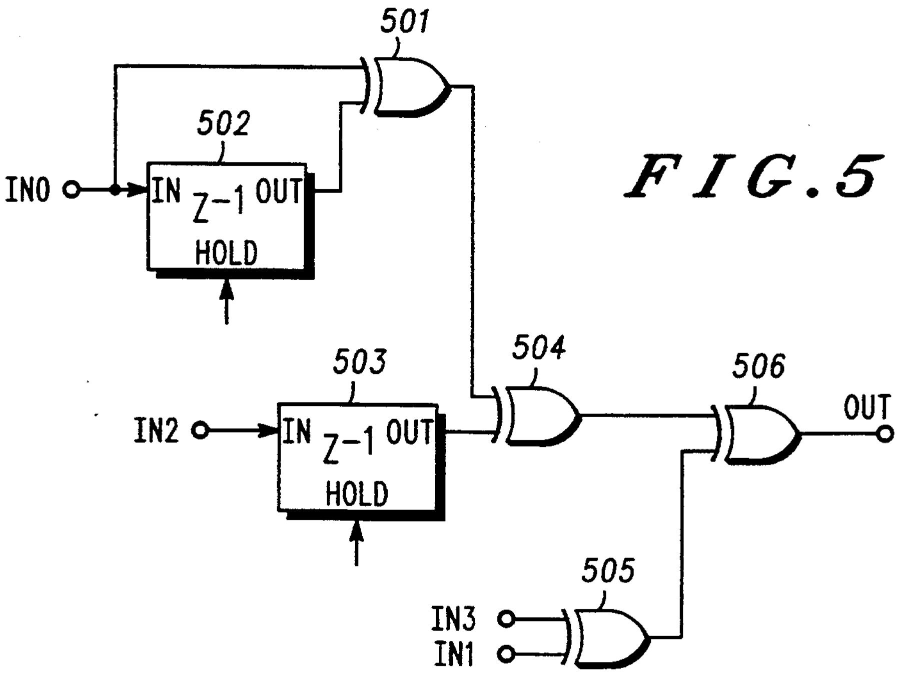
FIG. 5 shows a block diagram of a second rate-¼ decoder.

The second rate-¼ decoder (108), illustrated in greater detail in FIG. 5, uses the following polynomials:

$$h_0(D)=1+D$$

$$h_1(D)=1$$

$$h_2(D)=D$$

$$h_3(D)=1$$

Referring to FIG. 5, this decoder (108) XORs (501) one of the inputs with the same input delayed by one delay unit (502). The output of this XOR operation (501) is XORed (504) with a second input delayed by one delay unit (503). The result of this operation (504) is XORed (506) with the XOR (505) of the remaining two inputs to generate the output of the decoder (108).

An output of one of the rate-¼ decoders (107 or 108) is input to a storage device (151) for later use. In the preferred embodiment, this storage device is random access memory (RAM) (151). It is not important which output signal to store since, unless the signals contain errors, both output signals are the same.

The outputs of the rate-¼ decoders (107 and 108) are XORed (109). This function can be accomplished by a hardware XOR gate or by a software process. This output of the XOR operation (109) produces a number of bits in error proportional to the BER of the channel.

A counter (111) keeps track of the number of errors found. The counter (111) is coupled to the output of the XOR operation. This count function can also be a hardware counter or a software process. The output of the count operation is an estimate of the number of bits in error for the user information.

If no errors are detected, the signals stored in RAM can be used as the decoded signals. There is no need to continue the process since further processing simply chooses the signal with the least number of errors. The proper RAM is chosen by first checking if the output of the rate-¼ counter (111) is zero. If this is true, the FACCH RAM (151) is enabled and the FACCH message used. Otherwise, if the output of the rate-½ counter (141) is zero, the user information RAM (150) is enabled and the user information used. This scheme gives priority to the FACCH message over the user information.

By using the signal stored in RAM, further processing is not required, thereby reducing the processor time required to decode the signal. If errors are found in the signal, however, the processing must continue to determine which signal to use for further decoding.

While the process, in the preferred embodiment, is implemented as a software process, it can also be implemented as a hardware circuit in an alternate embodiment.

The signal decoding process of the present invention greatly reduces the processing time required to decode an error-free, convolutionally encoded signal. This process stores the decoded signals in RAM to be used if no errors are found in the signals. If the decoded signal is error-free, the process of the present invention does not require further processing and therefore uses less processor time than previous methods, thereby educing the power requirements of the processor.

I claim:

1. A method for decoding a convolutionally encoded signal that has been encoded by a first transfer function, the method comprising the steps of:

processing the convolutionally encoded signal with a second transfer function to generate a first output signal;

processing the convolutionally encoded signal with a third transfer function to generate a second output signal;

saving the first output signal;

combining the first and the second output signals to generate an error signal; and using the saved first output signal as the decoded signal when the error signal indicates zero errors.

2. The method of claim 1 wherein the step of combining includes exclusive ORing the first and the second output signals.

3. In a receiver, a method for decoding a rate-½ convolutionally encoded signal and a rate-¼ convolutionally encoded signal to produce a decoded signal, the rate-½ convolutionally encoded signal encoded by a first transfer function and the rate-¼ convolutionally encoded signal encoded by a second transfer function the method comprising the steps of:

processing the rate-½ convolutionally encoded signal with a third transfer function to generate a first output signal;

processing the rate-½ convolutionally encoded signal with a fourth transfer function to generate a second output signal;

processing the rate-¼ convolutionally encoded signal with a fifth transfer function to generate a third output signal;

processing the rate-¼ convolutionally encoded signal with a sixth transfer function to generate a fourth output signal;

saving the first and fourth output signals;

combining the first and second output signals to produce a first error signal;

combining the third and fourth output signals to produce a second error signal;

using the first saved output signal as the decoded signal when the first error signal indicates a number of errors equal to zero; and using the fourth saved output signal as the decoded signal when the first error signal indicates a number of errors greater than zero and the second error signal indicates a number of errors equal to zero.

4. The method of claim 3 and further including the step of performing further processing to determine which signal is to be decoded when the first and the second error signal each indicate a number of errors greater than zero.

5. A communication system comprising:

a transmitter for generating a rate-½ convolutionally encoded signal and a rate-¼ convolutionally encoded signal, the rate-½ convolutionally encoded signal encoded by a first transfer function and the rate-¼ convolutionally encoded signal encoded by a second transfer function; and a receiver for decoding the rate-½ convolutionally encoded signal and the rate-¼ convolutionally encoded signal to produce a decoded signal, the receiver including:

a first inverse convolutional encoder for processing the rate-½ convolutionally encoded signal with a third transfer function, thus generating a first output signal;

a second inverse convolutional encoder for processing the rate-½ convolutionally encoded signal with a fourth transfer function, thus generating a second output signal;

a third inverse convolutional encoder for processing the rate-¼ convolutionally encoded signal with a fifth transfer function, thus generating a third output signal;

a fourth inverse convolutional encoder for processing the rate-¼ convolutionally encoded signal with a sixth transfer function, thus generating a fourth output signal;

a first memory for storing the first output signal;

a second memory for storing the fourth output signal;

a first signal combiner for generating a first error signal in response to the first and second output signals, wherein the first output signal is used as the decoded signal when the first error signal indicates a number of errors is equal to zero; and a second signal combiner for generating a second error signal in response to the third and fourth output signals, wherein the fourth output signal is used as the decoded signal when the first error signal indicates the number of errors is greater than zero, and the second error signal indicates that the number of errors is equal to zero.

* * * * *